US005753936A

United States Patent [19]

Komatsu et al.

[11] Patent Number: 5,753,936

[45] Date of Patent: May 19, 1998

[54] IMAGE FORMING MEMBER FOR ELECTROPHOTOGRAPHY

[75] Inventors: Toshiyuki Komatsu, Kawasaki; Yutaka Hirai; Katsumi Nakagawa, both of Tokyo; Tadaji Fukuda, Kawasaki, all of Japan

[73] Assignee: Canon Kabushiki Kaisha, Tokyo, Japan

[21] Appl. No.: 479,856

[22] Filed: Jun. 7, 1995

Related U.S. Application Data

[63] Continuation of Ser. No. 171,979, Dec. 23, 1993, abandoned, which is a continuation of Ser. No. 44,881, Apr. 7, 1993, abandoned, which is a continuation of Ser. No. 873,889, Apr. 24, 1992, abandoned, which is a continuation of Ser. No. 716,768, Jun. 19, 1991, abandoned, which is a continuation of Ser. No. 449,310, Dec. 6, 1989, abandoned, which is a continuation of Ser. No. 333,759, Apr. 5, 1989, abandoned, which is a continuation of Ser. No. 104,584, Oct. 2, 1987, abandoned, which is a continuation of Ser. No. 912,699, Sep. 29, 1986, abandoned, which is a continuation of Ser. No. 719,445, Apr. 3, 1985, abandoned, which is a continuation of Ser. No. 561,161, Dec. 14, 1983, abandoned, which is a continuation of Ser. No. 418,293, Sep. 15, 1982, Pat. No. 4,565,731, which is a continuation of Ser. No. 36,226, May 4, 1979, Pat. No. 4,471,042.

[30] Foreign Application Priority Data

| | | | |
|---|---|---|---|
| May 4, 1978 | [JP] | Japan | 53/53605 |
| May 4, 1978 | [JP] | Japan | 53/53606 |

[51] Int. Cl.[6] .............. H01L 13/00; G03G 5/04

[52] U.S. Cl. .............. 257/53; 257/55; 257/59

[58] Field of Search .............. 357/2; 257/55, 257/58, 59, 53

[56] References Cited

U.S. PATENT DOCUMENTS

| | | | |
|---|---|---|---|
| 3,424,661 | 1/1969 | Androshunk et al. | 257/55 |
| 3,607,388 | 9/1971 | Hori et al. | 257/55 |
| 3,655,438 | 4/1972 | Sterling et al. | 257/52 |
| 3,670,198 | 6/1972 | Lehovec et al. | 315/11 |
| 3,943,218 | 3/1976 | Dietze et al. | 264/81 |
| 4,064,521 | 12/1977 | Carlson et al. | 257/52 |
| 4,109,271 | 8/1978 | Pankove | 357/30 |
| 4,141,764 | 2/1979 | Authier et al. | 148/174 |
| 4,142,195 | 2/1979 | Carlson et al. | 257/52 |
| 4,147,667 | 4/1979 | Chevallier et al. | 257/52 |
| 4,177,474 | 12/1979 | Ovshinsky | 357/2 |
| 4,217,374 | 8/1980 | Ovshinsky et al. | 257/52 |
| 4,225,222 | 9/1980 | Kempter | 257/52 |
| 4,226,897 | 10/1980 | Coleman | 427/39 |
| 4,226,898 | 10/1980 | Ovshinsky et al. | 257/57 |
| 4,265,991 | 5/1981 | Hirai et al. | 257/55 |
| 4,522,663 | 6/1985 | Ovshinsky et al. | 357/2 X |
| 4,525,442 | 6/1985 | Shirai et al. | 357/2 X |
| 4,664,998 | 5/1987 | Komatsu et al. | 430/64 |

OTHER PUBLICATIONS

Sze, S.M., *Physics of Semiconductor Devices*, John Wiley, 1981, pp. 32 & 293.

"Electrical and Optical Properties of Amorphous Silicon Carbide, Silicon Nitride and Germanium Carbide Prepared by Glow Dis-charge", Philosophical Magazine, vol. 35, pp. 1–16 (1977).

M. Le Contellec, et al., "Effects of the Silc on to Carbon Ratio and the H Content of Amorp. S.C. Thin Films Prepared by Reactive Sputtering." Thin Solid Films, 58 (1979) pp. 407–411.

Moustakas, et al. *Preparation of Highly Photoconductive Amorphous Silicon by rf Sputtering*, Solid State Comm., vol. 23, pp. 155–158.

*Primary Examiner*—Donald Monin

*Attorney, Agent, or Firm*—Fitzpatrick, Cella, Harper & Scinto

[57] ABSTRACT

An image-forming member for electro-photography has a photoconductive layer comprising a hydrogenated amorphous semiconductor composed of silicon and/or germanium as a matrix and at least one chemical modifier such as carbon, nitrogen and oxygen contained in the matrix.

16 Claims, 2 Drawing Sheets

IMAGE FORMING MEMBER FOR ELECTROPHOTOGRAPHY

This application is a continuation of application Ser. No. 08/171,979, filed Dec. 23, 1993, now abandoned, which in turn, is a continuation of application Ser. No. 08/044,881, filed Apr. 7, 1993, now abandoned, which in turn, is a continuation of application Ser. No. 07/873,889, filed Apr. 24, 1992, now abandoned; which in turn, is a continuation of application Ser. No. 07/716,768, filed Jun. 19, 1991, now abandoned; which in turn, is a continuation of application Ser. No. 07/449,310, filed Dec. 6, 1989, now abandoned; which in turn, is a continuation of application Ser. No. 333,759, filed Apr. 5, 1989, now abandoned; which in turn, is a continuation of application Ser. No. 104,584, filed Oct. 2, 1987, now abandoned; which in turn is a continuation of application Ser. No. 912,699, filed Sep. 29, 1986, now abandoned; which in turn is a continuation of application Ser. No. 719,445, filed Apr. 3, 1985 now abandoned; which in turn, is a continuation of application Ser. No. 561,161, filed Dec. 14, 1983 now abandoned; which in turn, is a continuation of application Ser. No. 418,293, filed Sep. 15, 1982, now U.S. Pat. No. 4,565,731; which in turn, is a continuation of application Ser. No. 036,226, filed May 4, 1979, now issued as U.S. Pat. No. 4,471,042.

BACKGROUND OF THE INVENTION

1. Field of the Invention

This invention relates to an image-forming member for electrophotography which is used to form images by utilizing electromagnetic wave such as light in a broad sense including for example, ultraviolet ray, visible ray, infrared ray, X-ray, gamma ray and the like.

2. Description of the Prior Art

Heretofore, there have been used inorganic photoconductive materials such as Se, CdS, ZnO and the like and organic photoconductive materials (OPC) such as poly-N-vinylcarbazole, trinitrofluorenone and the like as a photoconductive material for photoconductive layers of electrophotographic image-forming members.

However, they are suffering from various drawbacks. For example, since Se has only a narrow spectral sensitivity range with respect to for example visible light, its spectral sensitivity is widened by incorporation of Te or As. As a result, an image-forming member of Se type containing Te or As is improved in its spectral sensitivity range, but its light fatigue is increased. On account of this, when the same, one original is continuously copied repeatedly, the density of the copied images is inadvantageously decreased, and fog occurs in the background of the image, and further undesirable ghost phenomenon takes place.

In addition, Se, As and Te are extremely harmful to man. Therefore, when an image-forming member is prepared, it is necessary to use a specially designed apparatus which can avoid contact between man and those harmful substances. Further, after preparation of an image-forming member having such a photoconductive layer formed of those substances, if the photoconductive layer is partly exposed, part of such layer is scraped off during the cleaning treatment for the image-forming member and mingles with developer, is scattered in copying machine and contaminates copied image, which causes contact between man and the harmful substances.

When Se photoconductive layer is subjected to a continuous and repetitive corona discharge, the electric properties are frequently deteriorated since the surface portion of such layer is crystallized or oxidized.

Se photoconductive layer may be formed in an amorphous state so as to have a high dark resistance, but crystallization of Se occurs at a temperature as low as about 65° C. so that the amorphous Se photoconductive layer is easily crystallized during handling, for example, at ambient temperature or by friction heat generated by rubbing with other members during image forming steps, and the dark resistance is lowered.

On the other hand, as for an electrophotographic image-forming member of binder type using ZnO, CdS and the like as photoconductive layer-constituting material, formation of the photoconductive layer having the desired properties is difficult because such layer consists of two components, that is, a photoconductive material and a binder resin and the former must be uniformly dispersed into the latter. Therefore, parameters determining the electrical and photoconductive, or physical and chemical properties of the photoconductive layer must be carefully controlled upon forming the desired photoconductive layer to attain a high reproducibility of the properties and a high yield of the photoconductive layer.

Accordingly, the image-forming member having such photoconductive layer is not suitable for mass production.

The binder type photoconductive layer is so porous that it is adversely affected by humidity and its electric properties are deteriorated when used at a high humidity, which results in formation of images having poor quality. Further, developer is allowed to enter into the photoconductive layer because of the porosity, which results in lowering release property and cleaning property. In particular, when the used developer is a liquid developer, the developer penetrates into the photoconductive layer so that the above disadvantages are enhanced.

CdS itself is poisonous to man. Therefore, attention should be paid so as to avoid contact with CdS and dispersion thereof upon production and use thereof.

ZnO is hardly poisonous to man, but ZnO photoconductive layer of binder type has low photosensitivity and narrow spectral sensitivity range and exhibits remarkable light fatigue and slow photoresponse.

Electrophotographic image-forming members comprising an organic photoconductive material such as poly-N-vinylcarbazole, trinitrofluorenone and the like have such drawbacks that the photosensitivity is low, the spectral sensitivity range with respect to the visible light region is narrow and in a shorter wave length region, and humidity resistance, corona ion resistance, and cleaning property are very poor.

In order to solve the above mentioned problems, new materials are demanded.

Among these new materials, there are amorphous silicon (hereinafter called "a-Si") and amorphous germanium (herein-after called "a-Ge").

Since electric and optical properties of a-Si or a-Ge film vary depending upon the manufacturing processes and manufacturing conditions and the reproducibility is very poor (relating to a-Si, for example, Journal of Electrochemical Society, Vol. 116, No. 1, pp 77–81, January 1969). For example, a-Si film produced by vacuum evaporation or sputtering contains a lot of defects such as voids so that the electrical and optical properties are adversely affected to a great extent. Therefore, a-Si had not been studied for a long time. However, in 1976 success of producing p-n junction of a-Si was reported (Applied Physics Letters, Vol. 28, No. 2, pp. 105–107, 15 Jan. 1976). Since then, a-Si drew attentions of scientists. In addition, luminescence which can be only weakly observed in crystalline silicon (c-Si) can be observed at a high efficiency in a-Si and therefore, a-Si has been researched for solar cells (for example, U.S. Pat. No. 4,064,521).

However, a-Si developed for solar cells can not be directly used for the purpose of photoconductive layers of practical electrophotographic image-forming members.

Solar cells take out solar energy in a form of electric current and therefore, the a-Si film should have a low dark resistivity for the purpose of obtaining efficiently the electric current at a good SN ratio [photo-current (Ip)/dark current (Id)], but if the resistivity is so low, the photosensitivity is lowered and the SN ratio is degraded. Therefore, the dark resistivity should be $10^5$–$10^8$ ohm·cm However, such degree of dark resistivity is so low for photoconductive layers of electrophotographic image-forming members that such a-Si film can not be used for the photoconductive layers. This problem is also pointed out in a-Ge film.

Photoconductive materials for electrophotographic image-forming members should have gamma value at a low light exposure region of nearly 1 since the incident light is a reflection light from the surface of materials to be copied and power of the light source built in electrophotographic apparatuses is usually limited.

Conventional a-Si or a-Ge can not satisfy the conditions necessary for electrophotographic processes.

Another report concerning a-Si discloses that when the dark resistance is increased, the photosensitivity is lowered. For example, an a-Si film having dark resistivity of about $10^{10}$ ohm·cm shows a lowered photoconductive gain (photocurrent per incident photon). Therefore, conventional a-Si film can not be used for electrophotography even from this point of view.

Other various properties and conditions required for photoconductive layers of electrophotographic image-forming member such as electrostatic characteristics, corona ion resistance, solvent resistance, light fatigue resistance, humidity resistance, heat resistance, abrasion resistance, cleaning properties and the like have not been known as for a-Si or a-Ge films at all.

This invention has been accomplished in the light of the foregoing. The present inventors have continued researches and investigations with great zeal concerning application of a-Si and a-Ge to electrophotographic image-forming member.

As the result, the present invention is based on the discovery that a photoconductive layer which is made of a hydrogenated amorphous semiconductor composed of silicon and/or germanium as a matrix and at least one chemical modifier such as carbon, nitrogen and oxygen contained in the matrix is very useful for electrophotography and is better in most of the required properties than a conventional photoconductive layer.

SUMMARY OF THE INVENTION

An object of the present invention is to provide an electrophotographic image-forming member which can give high quality images having a high image density, sharp half tone and high resolution.

Another object of the present invention is to provide an electrophotographic image-forming member which has a high photosensitivity, a wide spectral sensitivity range covering almost all the visible light range and a fast photoresponse properties.

A further object of the present invention is to provide an electrophotographic image-forming member which has abrasion resistance, cleaning properties and solvent resistance.

Still another object of the present invention is to provide an electrophotographic image-forming member which requires few restrictions with respect to the period of time required until the commencement of development of electrostatic image since formation of such image and the period of time required for the development.

A still further object of the present invention is to provide an electrophotographic image-forming member, the preparing process for which is able to be carried out in an apparatus of a closed system to avoid the undesirable effects to man and which electrophotographic image-forming member is not harmful to living things as well as man and further to environment upon the use and therefore, causing no pollution.

Still another object of the present invention is to provide an electrophotographic image-forming member which has moisture resistance, thermal resistance and constantly stable electrophotographic properties and is of all environmental type.

A still further object of the present invention is to provide an electrophotographic image-forming member which has a high light fatigue resistance and a high corona discharging resistance, and is not deteriorated upon repeating use.

According to the present invention, there is provided an image-forming member for electrophotography which comprises a photoconductive layer comprising a hydrogenated amorphous semiconductor composed of silicon and/or germanium as a matrix and at least one chemical modifier such as carbon, nitrogen and oxygen contained in the matrix.

DESCRIPTION OF THE PREFERRED EMBODIMENTS

Figure 1:
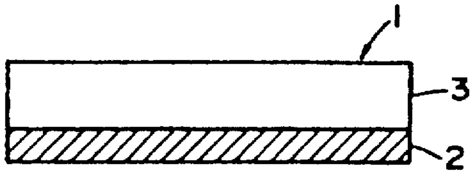
FIG. 1 and FIG. 2 are schematic cross-sectional views of a layer structure of preferred embodiments of an electrophotographic image-forming member according to the present invention.
Figure 2:
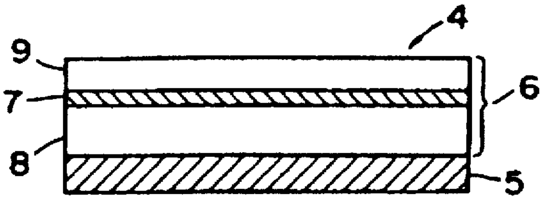

Representative examples of the electrophotographic image-forming member are shown in FIG. 1 and FIG. 2.

In FIG. 1, an electrophotographic image-forming member 1 is composed of a support 2 and a photoconductive layer 3, and photoconductive layer 3 has a free surface which becomes an image-forming surface. The photoconductive layer 3 is composed of a hydrogenated amorphous semiconductor consisting of silicon and/or germanium as a matrix and at least one of carbon, oxygen and nitrogen as a chemical modifier.

Photosensitivity and dark resistance are remarkably enhanced when a photoconductive layer is formed by using a hydrogenated amorphous semiconductor composed of silicon and/or germanium as a matrix and at least one chemical modifier such as carbon, oxygen and nitrogen contained in the matrix, and the photoconductive layer has electrophotographic characteristics which are the same as or better than those of conventional Se-type photoconductive layers..

A photoconductive layer composed of such hydrogenated amorphous semiconductor may be produced by introducing a gas of oxygen, nitrogen or a compound such as carbon compounds, oxygen compounds, and nitrogen compounds together with raw material gases capable of forming a hydrogenated amorphous silicon (hereinafter called "a-Si: H") and/or a hydrogenated amorphous germanium (hereinafter called "a-Ge: H") into a deposition chamber capable of being evacuated and causing a glow discharge in the deposition chamber.

Alternatively, a photoconductive layer composed of such a hydrogenated amorphous semiconductor may be produced by a sputtering method using a target for sputtering composed of a shaped mixture, for example, (Si+C), (Ge+C), (Si+Ge+C), ($Si+C+SiO_2$), ($Si+C+Si_3N_4$), ($Si+SiO_2$), and ($Si+Si_3N_4$), at a desired component ratio; or using a plurality of targets composed of an Si and/or Ge wafer and a C, $SiO_2$, or $Si_3N_4$ wafer; or introducing oxygen gas, nitrogen gas or a gas containing a carbon, oxygen or nitrogen gas together with a base gas for sputtering such as argon gas and the like into a deposition chamber and using a target of Si, Ge or (Si+Ge).

According to the present invention, most of carbon, oxygen and nitrogen compounds can be used in the present invention as far as the compounds do not bring unnecessary impurities into the photoconductive layer and carbon, oxygen and nitrogen can be incorporated in the photoconductive layer in a form of an effective chemical modifier. As such carbon, oxygen and nitrogen compounds, those which are gas at room temperature are preferable.

For example, as an oxygen compound, there may be used oxygen ($O_2$), carbon monoxide, carbon dioxide, nitrogen monoxide, nitrogen dioxide and the like. As a nitrogen compound, there may be used nitrogen ($N_2$), nitrogen monoxide, nitrogen dioxide, ammonia and the like. As a carbon compound, there may be used saturated hydrocarbons having 1–4 carbon atoms, ethylenic hydrocarbons having 1–4 carbon atoms, and acetylenic hydrocarbons having 2–3 carbon atoms. In particular, there are mentioned a saturated hydrocarbon such as methane ($CH_4$), ethane ($C_2H_6$), propane ($C_3H_8$), and n-butane (n-$C_4H_{10}$); an ethylenic hydrocarbon such as ethylene ($C_2H_4$), propylene ($C_3H_6$), butane-1 ($C_4H_8$), butane-2 ($C_4H_8$), and isobutylene ($C_4H_8$); and an acetylenic hydrocarbon such as acetylene ($C_2H_2$) and methyl acetylene ($C_3H_4$).

An amount of a chemical modifier in the formed photoconductive layer affects characteristics of the photoconductive layer to a great extent and should be appropriately determined. The amount is usually 0.1–30 atomic %, preferably 0.1–20 atomic %, more preferably 0.2–15 atomic %.

The photoconductive layer may be produced in a form of a layer by using one kind of the following hydrogenated amorphous semiconductors, or by selecting at least two kinds of the following hydrogenated amorphous semiconductors and bringing different types of them into contact with each other.

① n-type

Containing a donor only or containing both a donor and an acceptor where the content of donor (Nd) is higher.

② p-type

Containing an acceptor only or containing both an acceptor and a donor where the content of acceptor (Na) is higher.

③ i-type where Na≅Nd≅O or Na≅Nd.

The hydrogenated amorphous semiconductor layer of the above-mentioned types of ①–③ as a photoconductive layer may be produced by doping the hydrogenated amorphous semiconductor layer with a controlled amount of on n-type impurity, a p-type impurity, or both of them upon forming the layer by a glow discharging method or a reactive sputtering method.

The present inventors have found that any hydrogenated amorphous semiconductor ranging from a stronger n-type (or a stronger p-type) to a weaker n-type (or a weaker p-type) by adjusting the concentration of impurity in the layer to a range of $10^{15}$–$10^{19}$ $cm^{-3}$.

The layer composed of hydrogenated amorphous semiconductor having a type selected from ①–③ may be produced on substrate 2 by depositing hydrogenated amorphous semiconductive material on substrate 2 in a desired thickness by glow discharge, sputtering, ion plating, ion implantation or the like.

These manufacturing methods may be optionally selected depending upon manufacturing conditions, capital investment, manufacture scales, electrophotographic properties and the like. Glow discharge is preferably used because controlling for obtaining desirable electrophotographic properties is relatively easy and impurities of Group III or Group V of the Periodic Table can be introduced into the layer composed of hydrogenated amorphous semiconductor in a substitutional type for the purpose of controlling the characteristics.

Further, according to the present invention, glow discharge and sputtering in combination can be conducted in the same system to form the photoconductive layer.

According to the present invention, the photoconductive layer 3 is composed of hydrogenated amorphous semiconductor for the purpose of enhancing dark resistivity and photosensitivity of the electrophotographic image forming member.

A photoconductive layer 3 composed of hydrogenated amorphous semiconductor may be prepared by incorporating hydrogen in the layer upon forming the layer 3 according to the following method.

In the present invention, "H is contained in a layer" means one of, or a combination of the state, i.e., "H is bonded to Si or Ge", and "ionized H is weakly bonded to Si or Ge in the layer", and "present in the layer in a form of $H_2$".

In order to incorporate H in layer 3, a silicon compound such as silanes, for example, $SiH_4$, $Si_2H_6$ and the like or a germanium compound such as germanes, for example, $GeH_4$, $Ge_2H_6$ and the like, or $H_2$ or the like is introduced into a deposition system upon forming layer 3 and then heat-decomposed or subjected to glow discharge to decompose the compound and incorporate H as layer 3 grows.

For example, when layer 3 is produced by a glow discharge, a silane gas such as $SiH_4$, $Si_2H_6$ and the like or a germane gas such as $GeH_4$ on the like may be used as the starting material for forming the amorphous semiconductor and, therefore, H is automatically incorporated in layer 3 upon formation of layer 3 by decomposition of such silane or germane.

Where reactive sputtering is employed, in a rare gas such as Ar or a gas mixture atmosphere containing a rare gas the sputtering is carried out with Si, Ge, or (Si+Ge) as a target while introducing H gas into the system or introducing a silane gas such as $SiH_4$, $Si_2H_6$ and the like or germane gas such as $GeH_4$ and the like or introducing $B_2H_6$, $PH_3$ or the like gas which can serve to doping with impurities.

The present inventors have found that an amount of H in layer 3 composed of hydrogenated amorphous semiconductor is a very important factor which determines whether the electrophotographic image forming member can be practically used.

Practically usable electrophotographic image forming members usually contains 1–40 atomic %, preferably, 5–30 atomic % of H in the photoconductive layer 3. When the content of H is outside of the above range, the electrophotographic image forming member has a very low or substantially no sensitivity to electromagnetic wave, and increase in carrier when irradiated by electromagnetic wave is a little and further the dark resistivity is markedly low.

Controlling an amount of H to be contained in the photoconductive layer 3 can be effected by controlling the deposition substrate temperature and/or an amount of a starting material introduced into the system which is used for incorporated H.

In order to produce a layer composed of hydrogenated amorphous semiconductor having a type selected from ①–③ mentioned as above, upon conducting glow discharge or reactive sputtering, the layer is doped with an n-type impurity (the layer is rendered a type ①), a p-type impurity (the layer is rendered a type ②), or with both of them while the amount of impurity to be added is controlled.

As an impurity used for doping the layer composed of hydrogenated amorphous semiconductor to make the p-type layer there may be mentioned elements of Group IIIA of the Periodic Table such as B, Al, Ga, In, Tl and the like, and as an impurity for doping the layer composed of hydrogenated amorphous semiconductor to make the n-type layer, there may be mentioned elements of Group VA of the Periodic Table such as, P, As, Sb, Bi, and the like.

These impurities are contained in the layer composed of hydrogenated amorphous semiconductor in an order to ppm so that problem of pollution is not so serious as that for a main component of a photoconductive layer. However, it is naturally preferable to pay attention to such problem of pollution. From this viewpoint, B, As, P and Sb are the most appropriate taking into consideration electrical and optical characteristics of the charge generation layer to be produced.

An amount of impurity with which the layer composed of hydrogenated amorphous semiconductor is doped may be appropriately selected depending upon electrical and optical characteristics of the layer. In case of impurities of Group III A of the Periodic Table, the amount is usually $10^{-6}$–$10^{-3}$ atomic %, preferably, $10^{-5}$–$10^{-4}$ atomic %, and in case of impurities of Group VA of the Periodic Table, the amount if usually $10^{-8}$–$10^{-3}$ atomic %, preferably $10^{-8}$–$10^{-4}$ atomic %.

The layer composed of hydrogenated amorphous semiconductor may be doped with these impurities by various methods depending upon the type of method for preparing the layer. These will be mentioned later in detail.

Thickness of the photoconductive layer 3 may be optionally selected depending upon the requested properties of layer 3. It is usually 1~80 microns, preferably 5~30 microns, more preferably 5~50 microns.

It is preferred to dispose a barrier layer capable of preventing injection of carriers from the substrate 2, side upon electroconductivizing for forming electrostatic images between substrate 2 and photoconductive layer 3 disposed on said substrate 2 in case of an image forming member where photoconductive layer 3 has a free surface and the free surface is electroconductivized for forming electrostatic images.

Materials for such barrier layer may be optionally selected depending upon the type of substrate 2 and electric properties of a layer disposed on substrate 2.

Representative materials for the barrier layer are $MgF_2$, $Al_2O_3$ and the like inorganic compounds, polyethylene, polycarbonates, polyurethanes, poly-para-xylylene and the like organic compounds, and Au, Ir, Pt, Rh, Pd, Mo and the like metals.

Substrate 2 may be conductive or insulating. Examples of conductive substrates are metals such as Al, Cr, Mo, Au, Ir, Nb, Ta, V, Ti, Pt, Pd and the like, their alloys, stainless steels, and the like. Examples of insulating substrates are films or sheet of synthetic resins such as polyesters, polyethylene, polycarbonates, cellulose triacetate, polypropylene, polyvinyl chloride, polyvinylidene chloride, polystyrenes, polyamides and the like, glass, ceramics, paper and the like.

At least one surface of the insulating substrate is preferably conductivized and another layer is mounted on said conductivized surface. For example, in case of glass, the surface is conductivized with $In_2O_3$, $SnO_2$ or the like, and in case of a synthetic resin film such as a polyester film, the surface is conductivized by vacuum vapor deposition, electron beam vapor deposition, sputtering or the like using Al, Ag, Pb, Zn, Ni, Au, Cr, Mo, Ir, Nb, Ta, V, Ti, Pt or the like, or by laminating with such metal.

The shape of substrate may be a type of drum, belt, plate or other optional shape. When a continuous high speed copying is desired, an endless belt or drum shape is desirable.

Thickness of the substrate may be optionally determined so as to produce a desired electrophotographic image forming member. When the electrophotographic image forming member is desired to be flexible, it is preferable that the substrate is as thin as possible. However, in such a case the thickness is usually more than 10 microns from the viewpoints of manufacturing, handling and mechanical strength of the substrate.

Referring to FIG. 2, electrophotographic image forming member 4 comprises a substrate 5, a photoconductive layer 6, and the photoconductive layer 6 contains a depletion layer 7, and has a free surface.

The depletion layer 7 may be formed in layer 6 by selecting at least two kinds of hydrogenated amorphous semiconductor of ①–③ types and forming layer 6 in such a way that two different kinds of materials are brought into junction. In other words depletion layer 7 may be formed as a junction portion between an i-type hydrogenated amorphous semiconductor layer and a p-type hydrogenated amorphous semiconductor layer by forming an i-type hydrogenated amorphous semiconductor layer on substrate 5 having desired surface characteristics and forming a p-type hydrogenated amorphous semiconductor layer on said i-type layer.

Hereinafter, a layer composed of a hydrogenated amorphous semiconductor on a substrate 5 side with respect to a depletion layer 7 is called an inner layer while that on a free surface side is called an outer layer. In other words, a depletion layer 7 is formed at a transition region in the junction between an inner layer and an outer layer when a photoconductive layer 6 is produced in such a way that two different types of hydrogenated amorphous semiconductor layers.

At a normal state, the depletion layer 7 is in a state that free carriers are depleted and therefore it shows a behavior of so-called intrinsic semiconductor.

In the present invention, an inner layer 8 and an outer layer 9 which are constituting a charge generation layer 303 are composed of the same hydrogenated amorphous semiconductive material and the junction portion (depletion layer 7) is a homo-junction and therefore, inner layer 8 and outer layer 9 form a good electrical and optical junction and the energy bands of the inner layer and the outer layer are smoothly joined.

Figure 3:
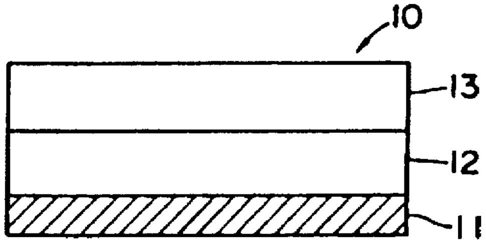
FIG. 3 is a schematic cross-sectional view of a layer structure of another preferred embodiment of an electrophotographic image-forming member according to the present invention.

Photoconductive layers of image-forming members illustrated in FIG. 1 and FIG. 2 have a free surface. A surface coating layer such as protective layer, insulating layer and the like may be disposed on the free surface in a way similar to some of conventional electrophotographic image-forming member. FIG. 3 illustrates an image-forming layer possessing such a surface coating layer.

In FIG. 3, electrophotographic image forming member 10 is composed of a covering layer 13 having a free surface, a photoconductive layer 12 composed of hydrogenated amorphous semiconductor and is substantially the same as the image forming member in FIG. 1 or FIG. 2 except that the covering layer is contained. However, the properties required for the covering layer 13 are different from one another depending upon the electrophotographic process employed. For example, when an electrophotographic process of U.S. Pat. Nos. 3,666,364 or 3,734,609 is employed, the covering layer 13 is insulating and electrostatic charge retentivity when electroconductivized is sufficiently high and thickness of the layer is thicker than a certain value. On the contrary, in case of an electrophotographic process such as Carlson process, thickness of the covering layer 13 is required to be very thin since it is desired that electric potential at the light portion is very small. Covering layer 13 is disposed taking into consideration the required electric properties, and further covering layer 13 should not adversely affect chemically or physically the photoconductive layer 12 which the covering layer 13 is contacted with, and additionally, covering layer 13 is formed taking an electrical contact property and an adhesivity with respect to a layer which the covering layer contacts, and humidity resistance, abrasion resistance, cleaning property and the like.

Thickness of covering layer 13 is optionally determined depending upon the required properties and the type of material used. It is usually 0.5–70 microns.

When covering layer 13 is required to have a protective function, the thickness is usually less than 10 microns while when it is required to behave as an electrically insulating layer, the thickness is usually more than 10 microns.

However, these values of thickness for a protective layer and for an insulating layer are only examples and may vary depending upon type of the material, type of the electrophotographic process employed and structure of the electrophotographic image forming member, and therefore the thickness, 10 microns, is not always a critical value.

Representative materials for a covering layer are synthetic resins such as polyethylene terephthalate, polycarbonate, polypropylene, polyvinyl chloride, polyvinylidene chloride, polyvinyl alcohol, polystyrene, polyamides, polyethylene tetrafluoride, polyethylene trifluoride chloride, polyvinyl fluoride, polyvinylidene fluoride, copolymers of propylene hexafluoride and ethylene tetrafluoride, copolymers of ethylene trifluoride and vinylidene fluoride, polyvutene, polyvinyl butyral, polyurethane and the like, and cellulose derivatives such as the diacetate, triacetate and the like.

These synthetic resin and cellulose derivative in a form of film may be adhered to the surface of the photoconductive layer 12, or a coating liquid of these materials is coated on the photoconductive layer 12.

The invention will be understood more readily by reference to the following examples; however, these examples are intended to illustrate the invention and are not to be construed to limit the scope of the invention.

EXAMPLE 1

Figure 4:
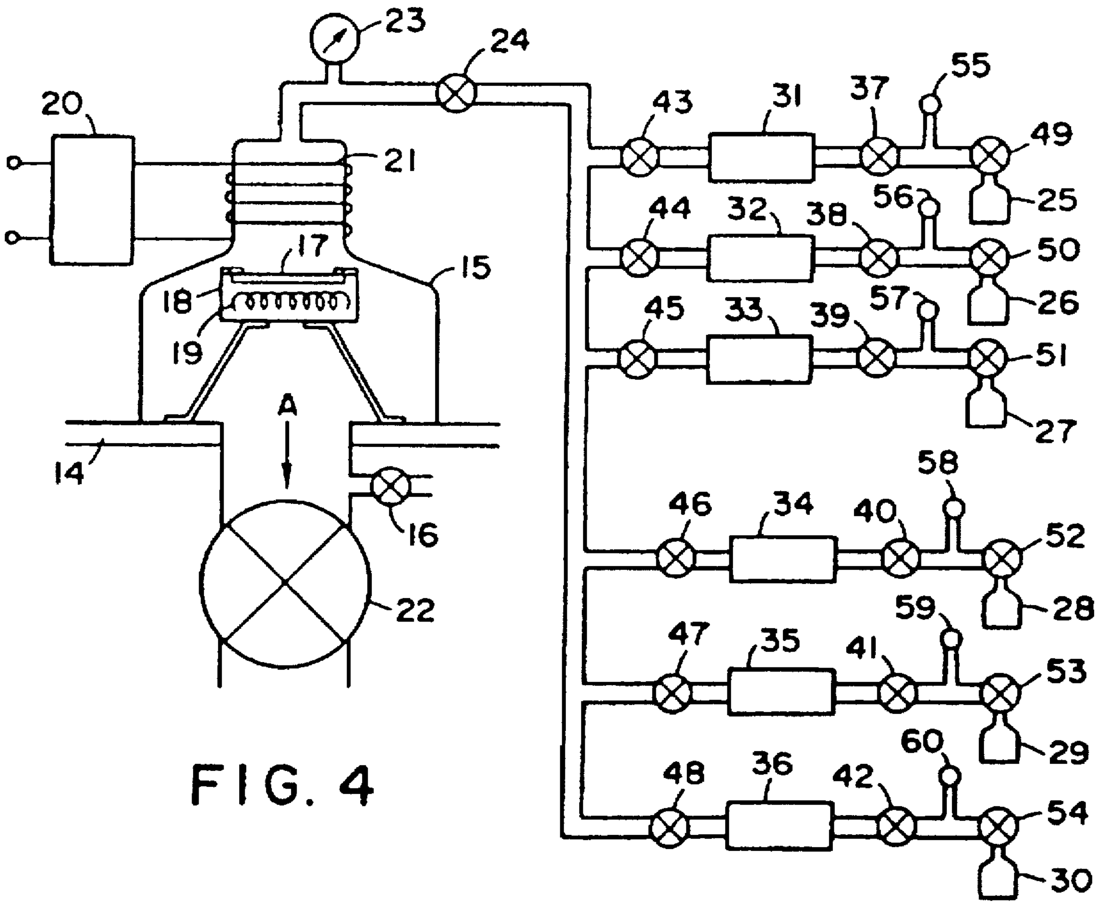
FIG. 4 is a schematic illustration of an apparatus which is used for preparation of an electrophotographic image-forming member of the present invention in accordance with an inductance type of glow discharging method.

An image-forming member for electrophotography was prepared by using an apparatus as shown in FIG. 4 placed in a sealed clean room in accordance with the following procedure.

An aluminum substrate 17 having a thickness of 0.2 mm and a diameter of 5 cm, the surface of which had been cleaned, was securely fixed to a fixing member 18 in a glow discharging deposition chamber 15 placed on a support 14. Substrate 17 was heated with accuracy of ±5° C. by a heater 19 in the fixing member 18.

The temperature of the substrate was measured in such a manner that the back side of the substrate was brought into-direct contact with a thermocouple (alumel-chromel).

The closed state of all values in the system was confirmed and then a main value 22 was fully opened to evacuate the air in deposition chamber 15 so that the vacuum degree was brought to about $5\times10^{-6}$ Torr. The input voltage of a heater 19 was increased and changed while the temperature of the aluminum substrate was detected so as to keep the substrate at 400° C.

Then a subsidiary valve 24 and outflow values 43 and 45 and inflow valves 37 and 39 were fully opened to evacuate sufficiently air even in flow meters 31 and 33. A subsidiary valve 24 and valves 43, 45, 37 and 39 were closed and then a valve 49 of a bomb 25 containing silane gas of 99.999% purity was opened and the pressure of an outlet pressure gauge 55 was adjusted to 1 kg/cm$^2$ and further an inflow valve 37 was gradually opened to introduce the silane gas into a flow meter 31. Then, outflow valve 43 was gradually opened and subsequently a subsidiary valve 24 was gradually opened until the pressure in deposition chamber 15 reached $1\times10^{-2}$ Torr. while the reading of Pirani gauge 23 was observed. After the inner pressure of deposition chamber 15 because stable, main valve 22 was gradually closed until the reading of Pirani gauge 23 became 0.5 Torr. After confirming the inner pressure, a valve 51 of a bomb 27 containing ethylene gas (99.999% purity) was opened and the pressure of outlet pressure gauge 57 was adjusted to 1 kg/cm$^2$. Inflow valve 39 was gradually opened so as to introduce ethylene gas into a flow meter 33 and an outflow valve 45 was gradually opened until the reading of flow meter 33 became 10% of the flow rate of silane gas, and the reading of flow meter 33 was stabilized.

A high frequency power source 20 was switched on in order to input a high frequency power of 5 MHz to an induction coil 21 so that a glow discharge was initiated with an input power of 30 W in the inside of the portion wound with a coil (the upper portion of the chamber) in chamber 15. Under the above mentioned conditions there was grown a photoconductive layer on the substrate and the same condition was kept for 8 hours. Then the high frequency power source 20 was switched off to stop the glow discharge. Then the power source of heater 19 was switched off and after the substrate temperature became 100° C., subsidiary valve 24, outflow valves 43 and 45 were closed and main valve 22 was fully opened to bring the pressure in chamber 15 to $10^{-5}$ Torr or below, then main valve 22 was closed and chamber 15 was brought to atmospheric pressure by way of a leak valve 16 and the substrate was taken out from the chamber. The total thickness of the resulting photoconductive layer was about 16 microns. The image-forming member thus produced was disposed in a device for charging and exposing experiment, and subjected to a corona discharge at ⊖ 6 KV for 0.2 sec. immediately followed by imagewise exposure. The light image was projected through a transparent test chart by using a tungsten lamp light source at 15 lux·sec. Immediately after the projection, a positively charged developer (containing both a toner and a carrier) was cascaded on the surface of the member to produce good toner images thereon. The resulting toner images were transferred onto a receiving paper by a +5 KV corona charging to obtain sharp and clear images of high resolution, high reproducibility of gradation and high density.

In the same apparatus, a flow rate of ethylene gas per the unit flow rate of silane gas was changed variously to produce image-forming members No. 2–No. 6 as shown in Table 1 below and a procedure of charge, exposure and development was applied to them under the same condition. The results are as shown in Table 1 below.

TABLE 1

| | Sample No. | | | | |
|---|---|---|---|---|---|
| | 2 | 3 | 4 | 5 | 6 |
| | Flow rate of ethylene % | | | | |
| Image quality | 0 | 2 | 5 | 10 | 20 |
| Image density | Δ | ○ | ⊙ | ⊙ | ⊙ |
| Sharpness | ⊙ | ⊙ | ⊙ | ○ | Δ |

Standard of judging image quality

⊙ Excellent

○ Good

Δ Practically usable

Then the flow rate ratio of ethylene gas to silane gas was fixed to 10 Vol. % while the temperature of aluminum substrate was varied as shown in Table 2 below to produce image-forming members No. 7–No. 11. The results are as shown below.

TABLE 2

| | Sample No. | | | | |
|---|---|---|---|---|---|
| | 7 | 8 | 9 | 10 | 11 |
| | Temperature of substrate (°C.) | | | | |
| Image quality | 200 | 300 | 400 | 500 | 600 |
| Image Density | ⊙ | ⊙ | ⊙ | ⊙ | ○ |
| Sharpness | Δ(⊙) | ○(⊙) | ⊙ | ⊙ | ○ |

Standard of judging image quality is the same as above. The sign in the parentheses is an image quality when heated at 400° C. in a nitrogen atmosphere for one hour. This shows that the heat treatment served to enhance sharpness of the photosensitive member prepared by deposition at a low substrate temperature.

EXAMPLE 2

An image-forming member for electrophotography was prepared by using an apparatus of FIG. 4 placed in a sealed clean room accordance with the following procedure.

An aluminum substrate 17 having a thickness of 0.2 mm and a diameter of 5 cm, the surface of which had been cleaned, was securely disposed in a fixing member 18 in a deposition chamber for glow discharge 15 placed on a support 14. The substrate 17 was heated with an accuracy of ±0.5° C. by means of a heater 19 in fixing member 18. Temperature of the substrate was measured in such a manner that the back side of the substrate was brought into direct contact with a chromel-alumel thermocouple. The closed state of all valves in the apparatus was confirmed and a main valve 22 was fully opened to evacuate air until the pressure in chamber 15 became about $5\times10^{-6}$ Torr.

The input voltage of heater 19 was enhanced while the temperature of aluminum substrate was observed and the input voltage was changed so that the substrate was constantly kept at 300° C.

Then, subsidiary valve 24, outflow valves 44, 46 and inflow valves 38 and 40 were fully opened and inside of flow meters 32 and 34 was sufficiently evacuated. After closing subsidiary valve 24, valves 44, 46, 32 and 34, a valve 50 of a bomb 26 containing germane gas (99.999% purity) was opened, the pressure of outlet pressure gauge 56 was adjusted to 1 $kg/cm^2$, and inflow valve 38 was gradually opened so as to introduce germane gas into flow meter 32. Outflow valve 44 was gradually opened, subsidiary valve 24 was also gradually opened, the opening of subsidiary valve 24 was adjusted while observing the reading of Pirani gauge 23 and subsidiary valve 24 was opened until the pressure in chamber 15 became $1\times10^{-2}$ Torr. After the pressure in chamber 15 became stable, main valve 22 was gradually closed until the reading of Pirani gauge became 0.5 Torr. After confirming the inner pressure, a valve 52 of a bomb 28 containing acetylene gas (99.99% purity) was opened and the pressure of outlet pressure gauge 58 was adjusted to 1 $kg/cm^2$, and inflow valve 40 was gradually opened to introduce acetylene into flow meter 34. Then, inflow valve 46 was gradually opened until the reading of flow meter 34 became 20% based on the flow rate of germane gas, and the reading was made stable.

A high frequency power source 20 was switched on to input a high frequency power of 5 MHz to an induction coil 21 so as to initiate a glow discharge with an input power of 10 W inside of the portion wound with a coil 21 (an upper area of the chamber). The same condition was kept for 8 hours to grow a hydrogenated amorphous semiconductor layer on the substrate, and then the high frequency power source 20 was switched off to stop the glow discharge, and subsequently, the power source of the heater was switched off. After the substrate temperature became 100° C., outflow valves 44 and 46 were closed and main valve 22 was fully opened until the pressure in the chamber became $10^{-5}$ Torr or below, and subsidiary valve 24 and main valve 22 were closed and then the pressure of chamber 15 was made to atmospheric pressure by a leak valve 16 and the substrate was taken out. In this case, the total thickness of the formed layer was about 18 microns. The image-forming member thus produced was disposed in a device for charging and exposing experiment and subjected to a corona discharge at ⊖ 6 KV for 0.2 sec. immediately followed by imagewise exposure. The light image was projected through a transparent test chart by using a xenon lamp light source at 15 lux·sec. Immediately after the projection, a positively charged developer (containing both a toner and a carrier) was cascaded on the surface of the member to produce good toner images thereon. The resulting toner images were transferred onto a receiving paper by a +5 KV corona charging to obtain sharp and clear images of high resolution, high reproducibility of gradation and high density.

EXAMPLE 3

An image-forming member for electrophotography was prepared by using an apparatus as shown in FIG. 4 placed in a sealed clean room in accordance with the following procedure.

An aluminum substrate 17 having a thickness of 0.2 mm and a diameter of 5 cm, the surface of which had been cleaned, was securely fixed to a fixing member 18 in a glow discharging deposition chamber 15. Substrate 17 was heated with accuracy of ±0.5° C. by a heater 19 in the fixing member 18.

The temperature of the substrate was measured in such a manner that the back side of the substrate was brought into direct contact with a thermocouple (alumel-chromel).

The closed state of all valves in the system was confirmed and then a main valve 22 was fully opened to evacuate the air in deposition chamber 15 so that the vacuum degree was brought to about $5\times10^{-5}$ Torr. The input voltage of a heater 19 was increased and changed while the temperature of the aluminum substrate was detected so as to keep the substrate at 350° C.

Then a subsidiary valve 24 and outflow valves 43, 44 and 45 and inflow valves 37, 38 and 39 were fully opened to evacuate sufficiently air even in flow meters 31, 32 and 33. A subsidiary valve 24 and valves 43, 44, 45, 37, 38 and 39 were closed and then a valve 49 of a bomb 25 containing silane gas of 99.999% purity was opened and the pressure of an outlet pressure gauge 55 was adjusted to 1 kg/cm$^2$ and further an inflow valve 37 was gradually opened to introduce the silane gas into a flow meter 31. Then, outflow valve 43 was gradually opened and subsequently a subsidary valve 24 was gradually opened until the pressure in deposition chamber 15 reached $1\times10^{-2}$ Torr while the reading of Pirani gauge 23 was observed. After the inner pressure of deposition chamber 15 became stable, main valve 22 was gradually closed until the reading of Pirani gauge 23 became 0.5 Torr. After confirming that the inner pressure became stable, a valve 50 of a bomb 26 containing germane gas (99.999% purity) was opened and the pressure of outlet pressure gauge 56 was adjusted to 1 kg/cm$^2$. Inflow valve 38 was gradually opened so as to introduce germane gas into a flow meter 32 and an outflow valve 44 was gradually opened until the reading of flow meter 32 became 30% of the flow rate of silane gas, and the reading of flow meter 33 was stabilized.

Then, a valve 51 of a bomb 27 containing ethylene gas (99.99% purity) was opened and an outlet pressure gauge 57 was adjusted to 1 kg/cm$^2$ and an inflow valve 39 was gradually opened to introduce ethylene gas into flow meter 33. Outflow valve 45 was gradually opened until the reading of flow meter 33 became 20% based on the flow rate of silane gas and it was stabilized.

A high frequency power source 20 was switched on in order to input a high frequency power of 5 MHz to an induction coil 21 so that a glow discharge was initiated with an input power of 30 W in the inside of the portion wound with a coil (the upper portion of the chamber) in chamber 15. There was grown a photoconductive layer on the substrate under the above mentioned condition, for 8 hours. Then the high frequency power source 20 was switched off to stop the glow discharge. Then the power source of the heater was switched off and after the substrate temperature became 100° C., subsidiary valve 24, outflow valves 43, 44 and 45 were closed and main valve 22 was fully opened to bring the pressure in chamber 15 to $10^{-5}$ Torr or below, then main valve 22 was closed and chamber 15 was brought to atmospheric pressure by way of a leak valve 16 and the substrate was taken out from the chamber. The total thickness of the resulting photoconductive layer was about 18 microns. The image-forming member thus produced was disposed in a device for charging and exposing experiment, and subjected to a corona discharge at ⊖ 6 KV for 0.2 sec. immediately followed by imagewise exposure. The light image was projected through a transparent test chart by using a tungsten lamp light source at 15 lux·sec. Immediately after the projection, a positively charged developer (containing both a toner and a carrier) was cascaded on the surface of the member to produce good toner images thereon. The resulting toner images were transferred onto a receiving paper by a +5 KV corona charging to obtain sharp and clear images of high resolution, high reproducibility of gradation and high density.

EXAMPLE 4

An aluminum substrate was disposed in a way similar to Example 1 and then a glow discharge deposition chamber 15 was evacuated in a way similar to Example 1 to bring the pressure to $5\times10^{-6}$ Torr and the substrate temperature was kept at 400° C. and then silane gas and ethylene gas (10% of the silane gas) were passed and the chamber was adjusted to 0.8 Torr. Further, phosphine gas was introduced into deposition chamber 15 together with silane gas and ethylene gas in such a way that an amount of phosphine gas was 0.03% of silane gas and the phosphine gas flowed from bomb 29 through valve 53 at a gas pressure of 1 Kg/cm$^2$ (reading at an outlet pressure gauge 59) and the phosphine gas flow was controlled by inflow valve 41 and outflow valve 47 while observing the reading of flow meter 35. After the inflow of gases became stable and the chamber pressure became constant and further the substrate temperature was stably 400° C., in a way similar to Example 1 a high frequency power source 20 was switched on so that a glow discharge was initiated. Under the above mentioned conditions the glow discharge was carried out for 6 hours, and then the high frequency power source 20 was switched off to stop the glow discharge. Then, outflow valves 43, 45 and 47 were closed, and subsidiary valve 24 and main valve 22 were fully opened to bring the pressure in chamber 15 to $10^{-6}$ Torr, and then subsidiary valve 24 and main valve 22 were closed while outflow flow valves 43 and 45 were gradually opened, and subsidiary valve 24 and main valve 22 were returned to such a state that the same flow rate of silane gas and ethylene gas as in case of forming the layer as mentioned above was brought about. Subsequently, a valve 54 of a bomb 30 containing diborane gas was opened to adjust the pressure at an outlet pressure gauge 60 to 1 kg/cm$^2$, and then inflow valve 42 was gradually opened to introduce diborane gas into flow meter 36. Further, outflow valve 48 was gradually opened until the reading of flow meter 36 became 0.04% based on the flow rate of the silane gas, and after the flow rate of silane gas into chamber 15 and that of ethylene gas into chamber 15 became stable.

Then, high frequency power source 20 was switched on to start glow discharge and the glow discharge was continued for 45 minutes. Heater 19 and higher frequency power source 20 were switched off, and after the substrate was cooled to 100° C., subsidiary valve 24, outflow valves 43, 45 and 48 were closed while main valve 22 was fully opened. Thus chamber 15 was once brought to $10^{-5}$ Torr or below, and main valve 22 was closed, and chamber 15 was brought to atmospheric pressure by leak valve 16.

Then the substrate was taken out. An image-forming member was thus produced. The thickness of the total layer thus formed was about 15 microns.

The image-forming member was tested with respect to image formation by placing the image-forming member in an experiment device for charging and exposing in a way similar to Example 1. A combination of ⊖ 6 KV corona discharge and a positively charged developer gave toner images of very good quality and high contrast on a receiving paper.

EXAMPLE 5

An aluminum substrate (4×4 cm) of 0.1 mm thick having a cleaned surface was placed on a fixing member 18 as shown in FIG. 4 in a way similar to Example 1 and then a glow discharge deposition chamber 15 and the whole gas inflow system were evacuated and the pressure became $5\times10^{-6}$ Torr. The substrate was kept at 450° C. In a way similar to Example 1, silane gas and ethylene gas (5% of flow rate of silane gas) were introduced into chamber 15 by operating each valve and the pressure in chamber 15 was brought to 0.3 Torr.

A valve 54 of bomb 30 containing diborane gas was opened and the pressure of outlet pressure gauge 60 was adjusted to 1 Kg/cm$^2$. Inflow valve 42 was gradually opened. Outflow valve 48 was also gradually opened until the reading of flow meter 36 became 0.10% of the flow rate of the silane gas and thus diborane gas was introduced. After flow rates of silane gas, ethylene gas and diborane gas became stable and the substrate temperature was stably 450° C., a high frequency power source 20 was switched on to initiate a glow discharge in chamber 15. Under these conditions a glow discharge was carried out for 15 minutes and then outflow valve 48 of bomb 30 was gradually closed watching a flow meter 36 while the glow discharge was further continued. Outflow valve 48 was closed until the flow rate of diborane gas because 0.03% of that of silane gas. Under these conditions the glow discharge was continued for further 8 hours and the high frequency power source was switched off to stop the glow discharge and then heater 19 was switched off to allow the substrate temperature to lower to 100° C. After that, subsidiary valve 24, outflow valves 43, 45 and 48 were all closed and main valve 22 was fully opened to bring once the pressure in chamber 15 to $10^{-5}$ Torr or below and then main valve 22 was closed and leak valve 16 was opened to let the pressure in chamber 15 return to atmospheric pressure. The substrate was taken out.

The total thickness of the formed layer was about 16 microns. The resulting sample was covered with an adhesive tape at the aluminum surface of the back side of the sample and then soaked in a 30% solution of a polycarbonate resin in toluene keeping the sample vertically followed by pulling up at a speed of 1.5 cm/sec to form a polycarbonate resin layer of 15 microns thick on the a-Si layer. Finally the adhesive tape was peeled off.

The resulting image-forming member was fixed to a rotatable drum of an experiment machine manufactured by modifying a commercial copying machine (trade name, NP-L7, supplied by Canon Kabushiki Kaisha) in such a manner that it was grounded. A series of steps, ⊖ 7 KV primary charging, exposure simultaneously with AC 6 KV charging, development (positively chargeable liquid developer), squeezing the liquid (roller squeezing), and transferring by ⊖ 5 KV charging was applied to the image-forming member to produce clear and sharp images of a high contrast on an ordinary paper.

Even after, the above-mentioned procedure was repeated 100,000 times, there was obtained images which were as good as those at the beginning.

EXAMPLE 6

An image-forming member for electrophotography was prepared by using an apparatus as shown in FIG. 4 placed in a sealed clean room in accordance with the following procedure.

An aluminum substrate 17 having a thickness of 0.2 mm and a diameter of 5 cm, the surface of which had been cleaned, was securely fixed to a fixing member 18 in a glow discharging deposition chamber 15 placed on a support 14. Substrate 17 was heated with accuracy of ±0.5° C. by a heater 19 in the fixing member 18. The temperature of the substrate was measured in such a manner that the back side of the substrate was brought into direct contact with a thermocouple (alumel-chromel).

The closed state of all valves in the system was confirmed and then a main valve 22 was fully opened to evacuate the air in deposition chamber 15 so that the vacuum degree was brought to about $5\times10^{-6}$ Torr. The input voltage of a heater 19 was increased and changed while the temperature of the aluminum substrate was detected so as to keep the substrate at 400° C.

Then a subsidiary valve 24 and outflow valves 43 and 45 and inflow valves 37 and 39 were fully opened to evacuate sufficiently air even in flow meters 31 and 33. A subsidiary valve 24 and valves 43, 45, 37 and 39 were closed and then a valve 49 of a bomb 25 containing-silane gas of 99.999% purity was opened and the pressure of an outlet pressure gauge 55 was adjusted to 1 Kg/cm$^2$ and further an inflow valve 37 was gradually opened to introduce the silane gas into a flow meter 31. Then, outflow valve 43 was gradually opened and subsequently a subsidiary valve 24 was gradually opened until the pressure in deposition chamber 15 reached $1\times10^{-2}$ Torr while the reading of Pirani gauge 23 was observed. After the inner pressure of deposition chamber 15 became stable, main valve 22 was gradually closed until the reading of Pirani gauge 23 became 0.5 Torr. After confirming the inner pressure became stable, a valve 51 of a bomb 27 containing ammonia gas (99.999% purity) was opened and the pressure of outlet pressure gauge 57 was adjusted to 1 Kg/cm$^2$. Inflow valve 39 was gradually opened so as to introduce ammonia gas into a flow meter 33 and an outflow valve 45 was gradually opened until the reading of flow meter 33 became 5% of the flow rate of silane gas, and the reading of flow meter 33 was stabilized.

A high frequency power source 20 was switched on in order to input a high frequency power of 5 MHz to an induction coil 21 so that a glow discharge was initiated with an input power of 30 W in the inside of the portion wound with a coil (the upper portion of the chamber) in chamber 15. The above mentioned conditions was kept for 10 hours so as to grow a hydrogenated amorphous semiconductor layer. Then the high frequency power source 20 was switched off to stop the glow discharge. Then the power source of heater 19 was switched off and after the substrate temperature became 100° C., subsidiary valve 24, outflow valves 43 and 45 were closed and main valve 22 was fully opened to bring the pressure in chamber 15 to $10^{-5}$ Torr or below, then main valve 22 was closed and chamber 15 was brought to atmospheric pressure by way of a leak valve 16 and the substrate on which a hydrogenated amorphous semiconductor layer was formed the substrate was taken out from the chamber. The total thickness of the resulting hydrogenated amorphous semiconductor layer was about 20 microns. The image-forming member thus produced was disposed in a device for charging and exposing experiment, and subjected to a corona discharge at ⊖ 6 KV for 0.2 sec. immediately followed by imagewise exposure. The light image was projected through a transparent test chart by using a tungsten lamp light source at 15 lux·sec. Immediately after the projection, a positively charged developer (containing both a toner and a carrier) was cascaded on the surface of the image-forming member to produce good toner images thereon. The resulting toner images were transferred onto a receiving paper by a +5 KV corona charging to obtain sharp and clear images of high resolution, high reproducibility of gradation and high density.

In the same apparatus the ratio of component gases was varied, that is, a flow rate of ammonia gas per a unit flow rate of silane gas was changed variously as shown in Table 3 below, and the above mentioned procedure of charge, exposure, and development was applied under the same condition. The results are as shown in Table 3 below.

TABLE 3

| | Flow rate of ammonia (%) | | | | |
|---|---|---|---|---|---|
| Image quality | 0 | 5 | 10 | 20 | 50 |
| Image density | Δ | ○ | ⊙ | ⊙ | ⊙ |
| Sharpness | ○ | ⊙ | ⊙ | ○ | X |

Standard of judging image quality

⊙ Excellent

○ Good

Δ Practically usable

X Poor

Then, the flow rate ratio of ammonia gas to silane gas was fixed to 10% and temperature of the aluminum substrate was changed. The results are as shown in Table 4 below.

TABLE 4

| | Substrate temperature °C. | | | | |
|---|---|---|---|---|---|
| Image quality | 200 | 300 | 400 | 500 | 600 |
| Image density | ⊙ | ⊙ | ⊙ | ⊙ | ○ |
| Sharpness | Δ(⊙) | ○(⊙) | ⊙ | ⊙ | ○ |

Standard of judging image quality is the same as that for Table 3 above. The sign in the parentheses in Table 4 above indicates an image-quality obtained when a heat treatment was effected at 400° C. for one hour. This shows that the sharpness was improved by the heat treatment; in case of an image-forming member having a hydrogenated amorphous semiconductor layer which was formed at a low substrate temperature.

EXAMPLE 7

In accordance with the operation described below, an electrophotographic image-forming member was prepared by using an apparatus as shown in FIG. 4 placed in a sealed clean room.

An aluminum substrate 17 of 0.2 mm in thickness and 5 cm in diameter was cleaned at its surface and then firmly fixed to a fixing member 18 placed at a predetermined position in a deposition chamber 15 for glow discharge set on a support 14. A heater 19 equipped in the fixing member 18 was ignited to heat the substrate with an accuracy of ±0.5° C. At that time, the temperature of the substrate was measured in such a manner that its back side was brought into direct contact with a chromel-alumel thermocouple.

The closed state of all valves in the apparatus was confirmed. A main valve 22 was fully opened to evacuate the air in the deposition chamber 15 so that the vacuum degree in the chamber was brought to about $5\times10^{-6}$ Torr. The input voltage of the heater 19 was increased while the temperature of the aluminum substrate was observed so that the substrate was kept at a constant temperature of 400° C.

A subsidiary valve 24, outflow valves 43 and 46, and inflow valves 37 and 40 were all fully opened to evacuate sufficiently the air in flow meters 31 and 34. As a result, those meters were brought to vacuum state. The valves 24, 43, 46, 37 and 40 were closed. Thereafter, a valve 49 of a bomb 25 to which silane gas of 99.999% purity had been charged was opened to adjust the pressure at an outlet pressure gauge 55 to 1 Kg/cm$^2$. The inflow valve 37 was gradually opened to introduce the silane gas into the flow meter 31. Successively, the outflow valve 43 as well as the subsidiary valve 24 were gradually opened. At that time, while the reading of a Pirani gauge 23 was observed carefully, the subsidiary valve 24 was regulated so that the vacuum degree in the deposition chamber 15 might be brought to $1\times10^{-2}$ Torr. After the inside pressure of the chamber 15 became stable, the main valve 22 was gradually closed so that the reading of the Pirani gauge might become 0.5 Torr.

After confirming that the inside pressure of the chamber 15 was stabilized, a valve 52 of a bomb 28 to which carbon dioxide gas of 99.999% purity had been charged was opened to adjust the pressure at an outlet pressure gauge 58 to 1 Kg/cm$^2$. The inflow valve 40 was gradually opened to introduce the carbon dioxide gas into the flow meter 34. At that time, the outflow valve 46 was regulated so that the reading of the flow meter 34 might indicate 0.5% based on the flow amount of the silane gas as mentioned above.

A high frequency power source 20 was switched on in order to input a high frequency power of 5 MHz to an induction coil 21 so that a flow discharge was initiated with an input power of 30 W in the inside of the portion wound with the coil 21, that is, the upper area of the chamber 15. The same condition was continued and kept for 8 hours for the purpose of forming a hydrogenated amorphous semiconductor layer on the substrate. Since then, the power source 20 was switched off to discontinue the glow discharge. The heater 19 was also turned off. After the substrate temperature reached 100° C., the subsidiary valve 24, and outflow valves 43 and 46 were closed, while the main valve 22 was fully opened to bring the inside of the chamber to $10^{-5}$ Torr or below. Thereafter, the main valve 22 was closed, and the inside of the chamber 15 was brought to atmospheric pressure by way of a leak valve 16, and then the substrate was taken out from the chamber. As the result of the above operation, a hydrogenated amorphous semiconductor layer was formed on the substrate and such layer had a total thickness of about 18 microns.

The image-forming member thus prepared was disposed in a device for charging and exposing experiment and subjected to a corona discharge at ⊖6 KV for 0.2 sec., immediately followed by imagewise exposure. The light image was projected through a transparent test chart by using a tungsten lamp light source at 10 lux·sec. Immediately after the projection, a positively charged developer (containing both a toner and a carrier) was cascaded on the surface of the image-forming member to form good toner images thereon. The toner images were transferred to a receiving paper by corona charging with +5 KV to obtain sharp and clear images of high resolution, high reproducibility of gradation and high density.

EXAMPLE 8

In accordance with the operation described below, an electrophotographic image-forming member was prepared by using an apparatus as shown in FIG. 4 placed in a sealed clean room.

An aluminum substrate 17 of 0.2 mm in thickness and 5 cm in diameter was cleaned at its surface and then firmly fixed to a fixing member 18 placed at a predetermined position in a deposition chamber 15 for glow discharge set on a support 14. A heater 19 equipped in the fixing member 18 was ignited to heat the substrate with an accuracy of ±0.5° C. At that time, the temperature of the substrate was measured in such a manner that its back side was brought into direct contact with a chromel-alumel thermocouple.

The closed state of all valves in the apparatus was confirmed. A main valve 22 was fully opened to evacuate the air in the deposition chamber 15 so that the vacuum degree in the chamber was brought to about $5\times10^{-6}$ Torr. The input voltage of the heater 19 was increased while the temperature of the aluminum substrate was observed so that the substrate was kept at a constant temperature of 350° C.

A subsidiary valve 24, outflow valves 44 and 46, and inflow valves 38 and 40 were all fully opened to evacuate sufficiently the air in flow meters 32 and 34. As a result, those meters were brought to vacuum state. The valves 24, 44, 46, 38 and 40 were closed. Thereafter, a valve 50 of a bomb 26 to which germane gas of 99.999% purity had been charged was opened to adjust the pressure at an outlet pressure gauge 56 to 1 kg/cm$^2$. The inflow valve 38 was gradually opened to introduce the germane gas into the flow meter 32. Successively, the outflow valve 44 as well as the subsidiary valve 24 were gradually opened. At that time, while the reading of a Pirani gauge 23 was observed carefully, the subsidiary valve 24 was regulated so that the vacuum degree in the deposition chamber 15 might be brought to $1\times10^{-2}$ Torr. After the inside pressure of the chamber 15 became stable, the main valve 22 was gradually closed so that the reading of the Pirani gauge might become 0.5 Torr.

After confirming that the inside pressure of the chamber 15 was stabilized, a valve 52 of a bomb 28 containing carbon dioxide gas of 99.99% purity was opened to adjust the pressure at an outlet pressure gauge 58 to 1 kg/cm$^2$. The inflow valve 40 was gradually opened to introduce the carbon dioxide gas into the flow meter 34. At that time, the outflow valve 46 was regulated so that the reading of the flow meter 34 might indicate 10% based on the flow amount of the germane gas as mentioned above.

A high frequency power source 20 was switched on in order to input a high frequency power of 5 MHz to an induction coil 21 so that a glow discharge was initiated with an input power of 30 W in the inside of the portion wound with the coil 2, that is, the upper area of the chamber 15. The same condition was continued and kept for 8 hours for the purpose of forming a hydrogenated amorphous semiconductor layer on the substrate. Since then, the power source 20 was switched off to discontinue the glow discharge. The heater 19 was also turned off. After the substrate temperature reached 100° C., the subsidiary valve 24, and outflow valves 44 and 46 were closed, while the main valve 22 was fully opened to bring the inside of the chamber to $10^{-5}$ Torr or below. Thereafter, the main valve 22 was closed, and the inside of the chamber 15 was brought to atmospheric pressure by way of a leak valve 16, and then the substrate was taken out from the chamber. As the result, a hydrogenated amorphous semiconductor thus formed on the substrate had a total thickness of about 18 microns.

The image-forming member thus prepared was disposed in a device for charging and exposing experiment and subjected to a corona discharge at ⊖ 6 KV for 0.2 sec., immediately followed by imagewise exposure. The light image was projected through a transparent test chart by using a xenon lamp light source at 15 lux·sec. Immediately after the projection, a positively charged developer (containing both a toner and a carrier) was cascaded on the surface of the image-forming member to form good toner images thereon. The toner images were transferred to a receiving paper by corona charging with +5 KV to obtain sharp and clear images of high resolution, high reproducibility of gradation and high density.

EXAMPLE 9

Figure 5:
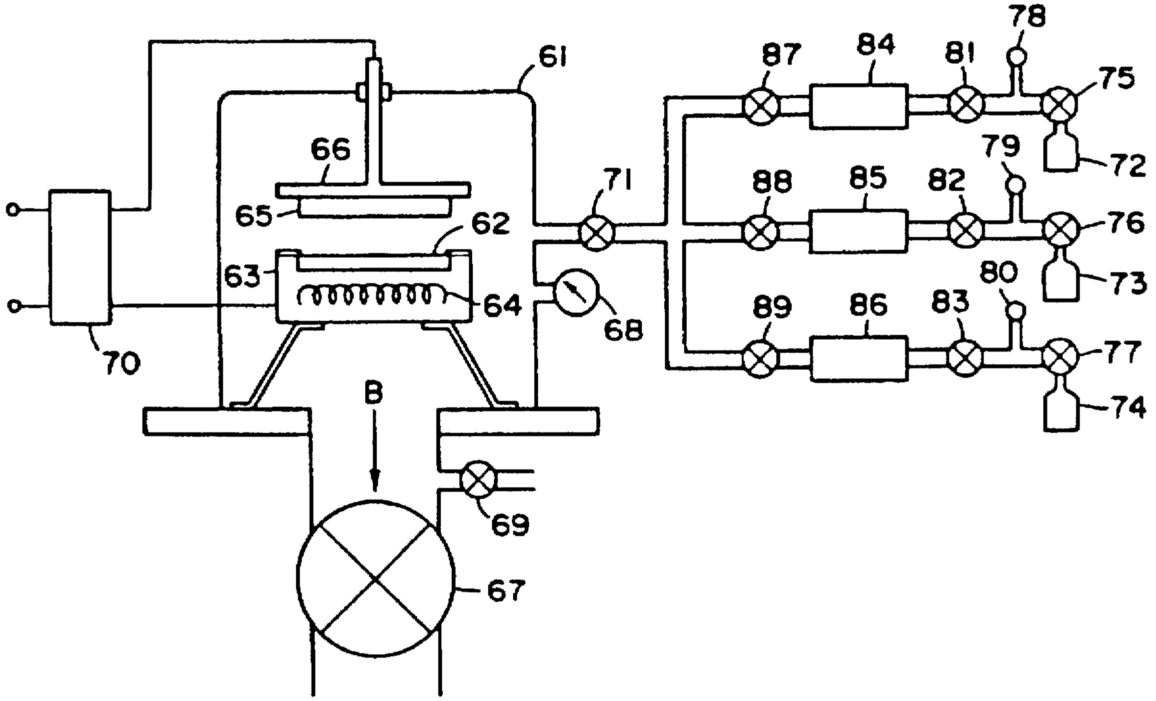
FIG. 5 is a schematic illustration of an apparatus which is used for preparation of an electrophotographic image-forming member of the present invention in accordance with a sputtering method.

In accordance with the following operation, an electrophotographic image-forming member was prepared by employing an apparatus as shown in FIG. 5.

An aluminum substrate 62 of 0.2 mm in thickness and 10×10 cm in size, the surface of which had been cleaned, was fixed to a fixing member 63 including therein a heater 64 and a thermocouple (not shown), in a sputtering deposition chamber 61. A polycrystalline silicon (99.999% in purity) target 65 was securely placed on an electrode 66 opposed to the substrate 62 so that it might be opposed to and made parallel to the substrate 62 and further kept apart from the substrate by about 4.5 cm.

A main valve 67 was fully opened to evacuate the air in the inside of the chamber 61 to bring the chamber to a vacuum degree of $5\times10^{-7}$ Torr or so. At that time, other valves than the main valve 67 were all closed. A subsidiary valve 71 and outflow valves 87, 88 and 89 were opened to evacuate sufficiently the air, and then the outflow valves 87, 88, 89 and subsidiary valve 71 were closed.

The substrate 62 was heated by heater 64 and kept at 200° C. A valve 75 of a bomb 72 containing therein hydrogen gas (purity: 99.99995%) was opened to adjust the outlet pressure to 1 kg/cm$^2$ while an outlet pressure gauge 78 was observed. Subsequently, an inflow valve 81 was gradually opened to allow the hydrogen gas to flow into a flow meter 84, and successively the outflow valve 87 was gradually opened and further the subsidiary valve 71 also opened.

While the inside pressure of the chamber 61 was measured by a pressure gauge 68, the outflow valve 87 was regulated to introduce the hydrogen gas into the chamber 61 so that the inside pressure of the chamber 61 might reach up to $5\times10^{-5}$ Torr.

A valve 76 of a bomb 73 to which argon gas (purity: 99.9999%) had been charged was opened and regulated so that the reading of an outlet pressure gauge 79 might indicate 1 kg/cm$^2$. Thereafter, an inflow valve 82 was opened and further the outflow valve 88 was gradually opened to allow the argon gas to flow into the chamber 61. The outflow valve 88 was gradually opened until the pressure gauge 68 indicated $5\times10^{-4}$ Torr, and under that condition, the flow amount of the argon gas was stabilized. Thereafter, the main valve 67 was gradually closed to bring the inside pressure of the chamber 61 to $1\times10^{-2}$ Torr.

Subsequently, a valve 77 of a bomb 74 containing therein nitrogen dioxide gas (purity: 99.99%) was opened to regulate the outlet pressure so that the reading of an outlet pressure gauge 80 might indicate 1 kg/cm$^2$. An inflow valve 83 was opened and an outflow valve 89 was gradually opened and regulated while a flow meter 86 was observed, in order to adjust the flow amount of the nitrogen dioxide gas to about 5% based on that of the hydrogen gas indicated by the flow meter 84. After the flow meters 84, 85 and 86 became stable, the high frequency power source 70 was switched on to apply alternating power of 13.56 MHz, 500 W, 1.6 KV between the target 65 and fixing member 63 thereby conducting discharge. Under that condition, the discharge was continued for 8 hours to form layer. Thereafter, the power source 70 was turned off together with the heater 64. After the substrate temperature reached 100° C. or below, the outflow valves 87, 88 and 89, and subsidiary valve 71 were closed, while the main valve 67 was fully opened to evacuate the gas in the chamber. The main valve 67 was then closed, and a leak valve 69 was opened to bring the inside pressure of the chamber 61 to the atmospheric pressure. Thereafter, the substrate 62 was taken out. A hydrogenated amorphous semiconductor layer was formed on the substrate and that layer was of about 18 microns in thickness.

The image-forming member thus prepared was tested in the same manner as in Example 6. When ⊖ 6 KV corona charging and positively charged developer were used, the obtained images were excellent in the resolution, reproducibility of gradation and density.

EXAMPLE 10

In accordance with the following operation, an electrophotographic image-forming member was prepared by employing an apparatus as shown in FIG. 5.

An aluminum substrate 62 of 0.2 mm in thickness and 10×10 cm in size, the surface of which had been cleaned, was fixed to a fixing member 63 including therein a heater 64 and a thermocouple (not shown), in a sputtering deposition chamber 61. A silicon-silicon dioxide target 65 was securely placed on an electrode 66 opposed to the substrate 62 so that it might be opposed to and made parallel to the substrate 62 and further kept apart from the substrate by about 4.5 cm. The target 65 had been prepared by mixing sufficiently 98 parts by weight of silicon powder (99.999% purity) and 2 parts by weight of silicon dioxide powder (99.99% purity) and hot-pressing the resulting mixture.

A main valve 67 was fully opened to evacuate the air in the inside of the chamber 61 to bring the chamber to a vacuum degree of $5\times10^{-7}$ Torr or so. At that time, other valves than the main valve 67 were all closed. A subsidiary valve 71 and outflow valves 87 and 88 were opened to evacuate sufficiently the air, and then the outflow valves 87, 88 and subsidiary valve 71 were closed.

The substrate 62 was heated by heater 64 and kept at 200° C. A valve 75 of a bomb 72 containing therein hydrogen gas (purity: 99.99995%) was opened to adjust the outlet pressure to 1 kg/cm$^2$ while an outlet pressure gauge 78 was observed. Subsequently, an inflow valve 81 was gradually opened to allow the hydrogen gas to flow into a flow meter 84, and successively the outflow valve 87 was gradually opened and further the subsidiary valve 71 also opened.

While the inside pressure of the chamber 61 was measured by a pressure gauge 68, the outflow valve 87 was regulated to introduce the hydrogen gas into the chamber 61 so that the inside pressure of the chamber 61 might reach up to $5\times10^{-5}$ Torr.

A valve 76 of a bomb 73 to which argon gas (purity: 99.9999%) had been charged was opened and regulated so that the reading of an outlet pressure gauge 79 might indicate 1 kg/cm$^2$. Thereafter, an inflow valve 82 was opened and further the outflow valve 88 was gradually opened to allow the argon gas to flow into the chamber 61. The outflow valve 88 was gradually opened until the pressure gauge 68 indicated $5\times10^{-4}$ Torr, and under that condition, the flow amount of the argon gas was stabilized. Thereafter, the main valve 67 was gradually closed to bring the inside pressure of the chamber 61 to $1\times10^{-2}$ Torr. After the flow amount of the gas and the inside pressure of the chamber 61 became stable, the high frequency power source 70 was switched on to apply alternating power of 13.56 MHz, 500 W, 1.6 KV between the target 65 and fixing member 63 thereby conducting discharge. Under that condition, the discharge was continued for 10 hours to form a layer. Thereafter, the power source 70 was turned off together with the heater 64. After the substrate temperature reached 100° C. or below, the outflow valves 87, 88, and subsidiary valve 71 were closed, while the main valve 67 was fully opened to evacuate the gas in the chamber. The main valve 67 was then closed, and a leak valve 69 was opened to bring the inside pressure of the chamber 61 to the atmospheric pressure. Thereafter, the substrate 62 was taken out. A hydrogenated amorphous semiconductor layer was formed on the substrate and that layer was of about 20 microns in thickness.

The image-forming member thus prepared was tested in the same manner as in Example 6. When ⊖ 6 KV corona charging and positively charged developer were used, the obtained images were excellent in the resolution, reproducibility of gradation-and density.

EXAMPLE 11

A molybdenum substrate of 0.2 mm in thickness and 5×5 cm in size, the surface of which had been cleaned, was disposed in the chamber 15 similarly to the case of Example 6. The inside of the chamber 15 was brought to a vacuum degree of $5\times10^{-6}$ Torr by using the same operation as in Example 6. After the substrate temperature was kept at 400° C., silane gas and ammonia gas were allowed to flow into the chamber 15 in the same manner as in Example 6 so that the inside of the chamber 15 was adjusted to 0.8 Torr. At that time, the flow amount of the ammonia gas was controlled to 0.5% based on that of the silane gas. Further, a valve 53 of a bomb 29 containing therein phosphine gas was opened to adjust the gas pressure at an outlet pressure gauge 59 to 1 kg/cm$^2$ while the reading of the gauge 59 was observed. An inflow valve 41 and outflow valve 47 were regulated to allow the phosphine gas to flow into the chamber 15 along with the silane and ammonia gases. At that time, the amount of the phosphine gas was adjusted to 0.61% based on that of the silane gas while the reading of a flow meter 35 was observed.

After the gas flow and the inside pressure of the chamber 15 became stable and the substrate temperature was stabilized at 400° C., the high frequency power source 20 was switched on to give rise to a glow discharge similarly to the case of Example 6. Under this condition, the glow discharge was conducted for 6 hours. The power source 20 was then switched off to discontinue the glow discharge.

The outflow valves 43, 45, 47 were closed, while the subsidiary valve 24 and main valve 22 were fully opened to bring the inside of the chamber 15 to a vacuum degree of $5\times10^{-6}$ Torr. The subsidiary valve 24 and main valve 22 were then closed. The outflow valves 43 and 45 were gradually opened, and the subsidiary valve 24 and main valve 22 were regulated to establish the same flow state of the silane gas and ammonia gas as in the case of forming the above-mentioned layer. The valve 54 of the bomb 30 containing diborane gas was opened to adjust the pressure at the outlet pressure gauge 60 to 1 kg/cm$^2$, and the inflow valve 42 was gradually opened to introduce the diborane gas into the flow meter 36. The outflow valve 48 was gradually opened and regulated so that the reading of the flow meter 36 might indicate 0.02% based on the flow amount of the silane gas.

After the flow amount of the diborane gas as well as that of the silane and ammonia gases became stabilized, the high frequency power source 20 was again switched on to initiate a glow discharge. Under that condition, such discharge was conducted for 45 minutes. The heater 19 as well as the power source 20 were then turned off. After the substrate temperature became 100° C., the subsidiary valve 24, and outflow valves 43, 45 and 48 were closed, while the main valve 22-was fully opened to control the inside of the chamber 15 to a vacuum degree of $10^{-5}$ Torr or below. Thereafter, the main valve 22 was closed, and then the inside of the chamber 15 was brought to the atmospheric pressure by way of the leak valve 16. The substrate was taken out. As the result of the above operation, a layer of about 15 microns in total thickness was formed on the substrate.

The image-forming member thus prepared was placed in an apparatus for charging and exposing experiment and tested in a similar image-forming process to that in Example 6. When corona charging with ⊖ 6 KV and positively charged developer were used, an extremely good toner image with high contrast was obtained on a receiving paper.

EXAMPLE 12

An aluminum substrate of 0.1 mm in thickness and 4×4 cm in size, the surface of which had been cleaned, was disposed on the fixing member 18 in the apparatus as shown in FIG. 4 similarly to Example 1. Subsequently, in the same manner as in Example 1, the glow discharge deposition chamber 15 and conduit for gas were brought to a vacuum degree of $5\times10^{-6}$ Torr, and the temperature of the substrate was kept at 450° C. Silane gas and ammonia gas were introduced into the chamber 15 in the same valve operation as in Example 6 so that the inside pressure of the chamber 15 was brought to 0.3 Torr. At that time, the flow amount of the ammonia gas was adjusted to 5% based on that of the silane gas.

The valve 54 of the bomb 30 containing therein diborane gas was opened to adjust the pressure at the outlet pressure gauge 60 to 1 kg/cm$^2$. The inflow valve 42 and outflow valve 48 were gradually opened to allow the diborane gas to flow into the chamber 15 in a flow amount of 0.05% based on that of the silane gas.

After the flow amount of the silane gas, ammonia gas and diborane gas became stable and the substrate temperature was stabilized at 450° C., the high frequency power source 20 was switched on to initiate a glow discharge in the chamber 15. Under that condition, such discharge was conducted for 15 minutes. Thereafter, while continuing the glow discharge, the outflow valve 48 for diborane was gradually closed and regulated so that the flow amount of the diborane gas might be decreased to 0.01% based on that of the silane gas, while the flow meter 36 was observed. Under that condition, the glow discharge was continued for 8 hours. The high frequency power source was switched off to discontinue the glow discharge, and the heater 19 also turned off. After the substrate temperature reached 100° C., the subsidiary valve 24 as well as the outflow valves 43, 45 and 48 were closed, while the main valve 22 was fully opened to adjust the inside of the chamber 15 to $10^{-5}$ Torr or below. The main valve 22 was then closed, and the leak valve 16 was opened to recover the inside of the chamber 15 to the atmospheric pressure. The substrate was taken out. As a result, a photoconductive layer was formed with total thickness of about 16 microns.

An adhesive tape was bonded to the aluminum substrate side of the sample prepared in the above operation. The sample was soaked into a 30% toluene solution of polycarbonate resin in the vertical direction and drawn up at a speed of 1.5 cm/sec. As a result, a polycarbonate resin layer of 15 microns in thickness was formed on the photoconductive layer. Further, the adhesive tape was removed.

The image-forming member thus prepared was fixed onto a drum of a copying machine (trade name, NP-L7, supplied by CANON K.K.) reconstructed into a test machine so that it might be grounded. The image-forming process comprising the primary charging with ⊖ 7 KV, charging with AC 6 KV simultaneous with exposure, developing with positively charged liquid developer, liquid-squeezing with roller and transferring with ⊖ 5 KV was conducted to obtain a sharp and clear image with high contrast on a plain paper. Even after such process was repeated to make a hundred thousand (100,000) or more copies, excellent image quality at the initial stage remained uncharged.

What we claim is:

1. An amorphous p-type semiconductor matrix formed by the process comprising:

(a) depositing on a support a matrix of amorphous hydrogenated silicon containing at least one chemical modifier, said chemical modifier being nitrogen in an amount from 0.1 to 30 atomic percent; and (b) simultaneously incorporating a p-type doping impurity in said matrix by gradually changing a rate of addition of said p-type impurity during step (a) to incorporate said p-type impurity in a non-uniform distribution in a gradual decreasing concentration from a support side to a free surface side within a range from $10^{15}$ to $10^{19}$ cm$^{-3}$ to form a region which acts as a depletion region in order to provide improved electrical properties and acts as a barrier layer in order to inhibit injection of carriers from the support side.

2. An amorphous p-type semiconductor matrix as defined in claim 1, wherein said doping impurity is boron.

3. An amorphous p-type semiconductor matrix formed by the process comprising:

(a) depositing on a support a matrix of amorphous hydrogenated silicon containing at least one chemical modifier, said chemical modifier being nitrogen in an amount from 0.1 to 30 atomic %; and (b) simultaneously incorporating a p-type doping impurity in said matrix by changing a rate of addition of said p-type impurity during step (a) to incorporate said p-type impurity in a higher amount at a support side and a lower amount at a free surface side within a range from $10^{15}$ to $10^{19}$ cm$^{-3}$ to form a region which acts as a depletion region in order to provide improved electrical properties and acts as a barrier layer in order to inhibit injection of carriers from the support side.

4. A semiconductor device formed by the process comprising:

(a) depositing on a support a photosensitive amorphous material comprising silicon as a matrix, hydrogen atoms and at least one element selected from the group consisting of oxygen, carbon and nitrogen; and (b) simultaneously incorporating an impurity for controlling conductive type in said photosensitive amorphous material by gradually changing a rate of addition of said impurity during step (a) to form on the support, in order, a first region containing a higher amount of said impurity and a second region containing a lower amount of said impurity to form a region which acts as a depletion region in order to provide improved electrical properties and acts as a barrier layer in order to inhibit injection of carriers from the support side.

5. The semiconductor device according to claim 4, wherein the impurity comprises p-type doping impurity.

6. The semiconductor device according to claim 4, wherein the one element selected from the group consisting of oxygen, carbon and nitrogen is contained in an amount from 0.1 to 30 atomic percent.

7. The semiconductor device according to claim 4, wherein the hydrogen atom is contained in an amount from 1 to 40 atomic percent.

8. The semiconductor device according to claim 5, wherein the p-type doping impurity comprises boron.

9. The semiconductor device according to claim 7, wherein the semiconductor device is an electrophotographic photosensitive member.

10. An electrophotographic image forming member produced by process comprising the steps of:

(a) providing a support in a film formation space;

(b) introducing into the space (i) a silane gas as a starting material gas, (ii) a starting material gas being a gas at room temperature containing at least one element selected from the group consisting of oxygen, carbon and nitrogen as a constituent element, and (iii) an impurity gas for controlling conductive type;

(c) generating a glow discharge; and (d) reducing an amount of the impurity gas introduced into the space during the generation of the glow discharge, thereby forming on the support an amorphous material having sufficient photosensitivity and dark resistance for electrophotography comprising silicon atom as a matrix, 0.1 to 30 atomic percent of at least one element selected from the group consisting of oxygen, carbon and nitrogen, 1 to 40 atomic percent of hydrogen atom and an impurity for controlling conductive type, wherein the impurity is distributed non-uniformly in the layer thickness direction in a larger amount at a support side and a smaller amount at a free surface side to form a region which acts as a depletion region in order to provide improved electrical properties and acts as a barrier layer in order to inhibit injection of carriers from the support side.

11. The member according to claim 10, wherein the impurity gas comprises diborane.

12. The member according to claim 10, wherein the impurity gas comprises phosphine.

13. A light-receiving member comprising a layer of hydrogenated amorphous silicon provided on a support, said layer comprising silicon atoms as a matrix, boron atoms, hydrogen atoms and 1 to 30 atomic percent of at least one element selected from the group consisting of oxygen, carbon and nitrogen atom, wherein the layer comprises a first region containing a higher amount of boron at a support side and a second region containing a lower amount of boron than said first region to form a region which acts as a depletion region in order to provide improved electrical properties and acts as a barrier layer in order to inhibit injection of carriers from the support side.

14. The member according to claim 13, wherein the boron is present in an atomic amount of from $10^{15}$ to $10^{19}$ $cm^{-3}$.

15. The member according to claim 13, wherein the light-receiving member is an electrophotographic photosensitive member.

16. The member according to claim 13, wherein the light-receiving member is an electrophotographic photosensitive member containing the boron atoms in an amount from $10^{15}$ to $10^{19}$ $cm^{-3}$ and hydrogen atoms in an amount from 1 to 40 atomic percent, thereby providing sufficient photosensitivity and dark resistance for electrophotography.

* * * * *

UNITED STATES PATENT AND TRADEMARK OFFICE
CERTIFICATE OF CORRECTION

PATENT NO. : 5,753,936

DATED : May 19, 1998

INVENTOR(S) : TOSHIYUKI KOMATSU, ET AL.

It is certified that error appears in the above-identified patent and that said Letters Patent is hereby corrected as shown below:

TITLE PAGE:
AT [30] FOREIGN APPLICATION PRIORITY DATA

"May 4, 1978 Japan 53/53605" should read
--May 4, 1978 Japan 53-53605--; and
"May 4, 1978 Japan 53/53606" should read
--May 4, 1978 Japan 53-53606--.

COLUMN 3

Line 5, "can not" should read --cannot--;
Line 17, "can not" should read --cannot--;
Line 26, "can not" should read --cannot--; and
Line 34, "can not" should read --cannot--.

COLUMN 5

Line 7, "layers.," should read --layers.--.

COLUMN 6

Line 9, "on" should read --an--.

COLUMN 7

Line 14, "increase" should read --there is little--;
Line 15, "is a little" should be deleted;
Line 49, "if" should read --is--; and
Line 61, "substrate 2," should read --substrate 2--.

UNITED STATES PATENT AND TRADEMARK OFFICE
CERTIFICATE OF CORRECTION

PATENT NO. : 5,753,936

DATED : May 19, 1998

INVENTOR(S) : TOSHIYUKI KOMATSU, ET AL.

It is certified that error appears in the above-identified patent and that said Letters Patent is hereby corrected as shown below:

COLUMN 8

Line 25, "metal." should read --metals.--; and
Line 61, "layers." should read --layers are formed.--.

COLUMN 9

Line 11, "member." should read --members.--.

COLUMN 10

Line 16, "back side" should read --backside--;
Line 17, "into-direct" should read --into direct--; and
Line 54, "above mentioned" should read --above-mentioned--.

COLUMN 11

Line 35, "aluminum." should read --the aluminum.--; and
Line 61, "accordance" should read --in accordance.--.

COLUMN 12

Line 3, "back side" should read --backside--.

COLUMN 13

Line 8, "back side" should read --backside--; and
Line 54, "above mentioned" should read --above-mentioned--.

UNITED STATES PATENT AND TRADEMARK OFFICE

CERTIFICATE OF CORRECTION

PATENT NO. : 5,753,936

DATED : May 19, 1998

INVENTOR(S) : TOSHIYUKI KOMATSU, ET AL.

It is certified that error appears in the above-identified patent and that said Letters Patent is hereby corrected as shown below:

COLUMN 14

Line 31, "above mentioned" should read --above-mentioned--.

COLUMN 15

Line 29, "because" should read --became--; and
Line 42, "back side" should read --backside--.

COLUMN 16

Line 6, "back side" should read --backside--; and
Line 45, "above mentioned" should read --above-mentioned--.

COLUMN 17

Line 8, "above mentioned" should read --above-mentioned--; and
Line 41, "treatment;" should read --treatment--.

COLUMN 22

Line 21, "gradation-and" should read --gradation and--.

COLUMN 23

Line 9, "22-was" should read --22 was--.

COLUMN 24

Line 41, "atomic %;" should read --atomic percent;--.

UNITED STATES PATENT AND TRADEMARK OFFICE
CERTIFICATE OF CORRECTION

PATENT NO. : 5,753,936

DATED : May 19, 1998

INVENTOR(S) : TOSHIYUKI KOMATSU, ET AL.

It is certified that error appears in the above-identified patent and that said Letters Patent is hereby corrected as shown below:

COLUMN 25

Line 16, "process" should read --the process--.

Signed and Sealed this

Nineteenth Day of January, 1999

Attest:

*Attesting Officer*

*Acting Commissioner of Patents and Trademarks*